United States Patent [19]

Bauer et al.

[11] Patent Number: 4,948,704

[45] Date of Patent: Aug. 14, 1990

[54] PROCESS OF FORMING IMAGED PHOTOHARDENED MATERIAL

[75] Inventors: Richard D. Bauer, Towanda, Pa.; Ursula A. Kraska, Pfungstadt; Manfred A. J. Sondergeld, Mulheim/Main, both of Fed. Rep. of Germany

[73] Assignee: E. I. Du Pont de Nemours and Company, Wilmington, Del.

[21] Appl. No.: 414,796

[22] Filed: Sep. 29, 1989

Related U.S. Application Data

[60] Division of Ser. No. 300,248, Jan. 23, 1989, Pat. No. 4,892,302 which is a continuation of Ser. No. 129,149, Dec. 7, 1987, abandoned, which is a continuation of Ser. No. 857,313, Apr. 30, 1986, abandoned.

[51] Int. Cl.$^5$ ............................................. G03C 5/00
[52] U.S. Cl. .................................. 430/291; 430/293; 430/260; 430/269; 430/281; 430/91 D
[58] Field of Search ............... 430/291, 293, 330, 270, 430/271, 281, 910, 260, 269

[56] References Cited

U.S. PATENT DOCUMENTS

| | | | |
|---|---|---|---|
| 2,905,555 | 9/1959 | Fuchsman | 430/91 D |
| 3,060,024 | 10/1962 | Burg et al. | 430/281 |
| 3,561,969 | 2/1971 | Burg | 430/271 |
| 3,582,327 | 6/1971 | Boyd et al. | 430/281 |
| 3,620,726 | 11/1971 | Chu et al. | 430/281 |
| 3,649,268 | 3/1972 | Chu et al. | 430/281 |
| 4,272,608 | 6/1981 | Proskow | 430/288 |
| 4,284,710 | 8/1981 | Burg | 430/271 |
| 4,343,888 | 8/1982 | Burg | 430/302 |

FOREIGN PATENT DOCUMENTS 1443369 7/1976 United Kingdom.

Primary Examiner—Jack P. Brammer

[57] ABSTRACT

A positively working, tonable, photohardenable mixture, as well as image-forming material prepared therefrom are described, which as essential components, contains a binder or mixture of binders, a photohardenable compound, a photoinitiator or an initiator system and a multivalent metal compound to improve the toning properties of the material.

7 Claims, No Drawings

PROCESS OF FORMING IMAGED PHOTOHARDENED MATERIAL

This is a division of application Ser. No. 07/300,248, filed Jan. 23, 1989, now U.S. Pat. No. 4,892,302 which is a continuation of application Ser. No. 07/129,149, filed Dec. 7, 1987, now abandoned, which is a continuation of application Ser. No. 06/857,313, filed Apr. 30, 1986, now abandoned.

FIELD

The subject of the present application is a positive-working tonable, photopolymerizable mixture with improved toning properties.

BACKGROUND

In the sector of photographic reproduction photohardenable recording materials have been used, in which differences in tackiness of the exposed and unexposed regions of the photohardenable film have been utilized for image production.

Thus, for example, from the German Pat. Nos. 1 210 321, 1 904 058, 1 904 059 and 2 004 214, a reproduction process has become known in which a tacky photopolymerizable recording material, consisting of a film support and a photopolymerizable film, which contains at least one addition-polymerizable monomer and a photopolymerization initiator, is hardened through imagewise exposure, whereby the exposed image portions lose their tackiness. The latent image is then made by applying suitable toner materials, which adhere only to the unexposed, tacky places, whereas, they can again be removed from the exposed, nontacky image portions after the application. Using this process, positive, possibly colored images of the original are obtained which are equal in appearance to pictures that were prepared with the use of printing inks. Therefore, the process has achieved considerable practical importance, especially in the printing industry, for testing color separations.

A not yet eliminated disadvantage of the process consists in that the achievable toned density is dependent on the toning temperature present, whereby especially strong fluctuations appear in the region of room temperature between 18° C. and 35° C. This temperature dependence of the toning process leads to a nonuniform covering of the unexposed regions with toner material, whereby a raising of the toning temperature produces an increased plasticity of the tacky, photohardenable film and therewith also an increased toner take-up.

Besides, the temperature dependence of the toning process can also lead to fog and spot formation as well as faulty colors. Especially in color testing processes, which must reproduce the color density and color shade of the production run exactly and reproducibly, such as impairment of the image-forming quality cannot be tolerated. The toning is usually carried out under given room conditions. A toning under constant climatic conditions requires expensive equipment, which is not practicable in practice, because a color testing process must be simple, fast in use and with a more favorable cost than the conventional proof copy method. From the German Offenlegungsschrift No. 2 364 179 and the German Offenlegungsschrift No. 3 012 841, it is known that the surface properties of relief printing forms can be improved through addition of compounds with cross-linking, multivalent metal cations and, in fact, above all can reduce the tackiness of the printing form.

From the German Offenlegungsschrift No. 2 364 179, it is known that multivalent metal salts are suitable for improving the adhesion between printing relief and substrate.

However, these patent applications do not disclose any photohardenable image-forming materials, which are suitable for the preparation of tonable image formations.

The problem of the present invention is to provide a positive working, tonable, photohardenable mixture, in which the temperature dependence of the toning process is reduced without impairment of other essential properties of the material, for example, the achievable toned density.

This problem was solved for the first time by a positive operating photohardenable mixture according to the characterizing portion of claim 1.

Summary of the Invention

Accordingly, the subject of the invention is a positive working tonable photohardenable mixture, consisting of
 a binder or mixture of binders,
 at least one photohardenable compound,
 a photoinitiator or an initiator system and
 optionally at least one additional, not photohardenable plasticizing compound.

The invention is characterized in that the photohardenable mixture for reducing the temperature dependence of the toning process contains at least one multivalent metal compound from the groups IIa—IVA, IIB—IVB and VIIB of the Periodic System, and the binder or at least one binder of the mixture of binders possesses a content of salt-forming groups of at least 2 weight-% based on the total weight of the binder composition, and the binder is selected so that with use of only one binder its glass (second order) transition temperature does not exceed 70° C. and with use of binder mixtures, the glass transition temperature of each individual binder does not exceed 80° C.

DETAILED DESCRIPTION

Suitable metal compounds, which produce an ionic cross linking of the polymeric binder containing salt-forming groups, are known from the literature. In the case of the present invention, especially cations from the groups IIA—IVA as well as IIB—IVB and VIIB of the periodic system (Holleman-Wiberg, Anorganische Chemie 81-90 edition, appendix), which have no interfering absorption in the visible region of the spectrum have been found to be suitable. The metal compounds can be added to the photohardenable film in the form of their salts, oxide, hydroxides, halides and alkoxides or as chelates.

Preferred cations are: Magnesium, calcium, strontium, barium, aluminum, tin, zinc, cadmium, titanium-(IV), zirconium and manganese(II).

Considered chiefly as anions are carboxylates of monobasic or multibasic carboxylic acids, such as acetates, oxalates and citrates, benzoates and phenolates and anions of inorganic acids, especially chlorides.

Preferred chelate structures are those with two-pronged ligands, which are capable of forming a five-membered or six-membered resonance system. Mentioned are metal acetylacetonates, triethanolamine, lactate and octylene glycol metal chelates. The metal compounds can be used alone or in any desired combination. The compounds are added to the photohardenable mixtures in amounts such that at least 10 weight-% of the salt-forming groups present in the polymeric binder are cross linked. The addition can take place at any desired time in the manufacture of the photohardenable mixture. However, to produce an especially uniform cross linking, it is suitable to add the metal compounds of the coating solution in the form of a solution or dispersion after addition of all other components with stirring.

Binders with groups suitable for salt formation are known in great number. These binders, preferably, contain acid salt-forming groups. Suitable, for example, are carboxyl, sulfonic acid, sulfonamide or hydroxyl groups.

Mentioned in detail are: Polymers of acrylic acid respectively methacrylic acid or their copolymers with other monomers, such a acrylic acid esters or other acrylic derivatives, vinyl compounds, such as vinyl ether, vinyl esters or their saponification products, styrene, vinylpyrrolidone, butadiene and related monomers, polyacrylic anhydrides, copolymers of maleic anhydride, maleic aid, half acid esters of maleic acid, half amides of maleic acid or anhydrides and derivatives of related compounds, such as itaconic acid, with suitable comonomers, such as styrene, vinyl ethers, vinyl esters etc. Biopolymers, for example, polysacchardies in their native or modified form and their derivatives, as well as modified derivatives, which contain salt-forming groups in the side chain, also can be used.

Thermoplastic binders on an acrylate and/or methacrylate basis have been found to be especially suitable.

The adjustment of the glass transition temperature present, due to the general knowledge in this field, is possible directly and presents no difficulties to the expert in the field.

In general, the amount of binder or mixture of binders amounts to 20–90 weight-%, preferably 30–70 weight-% based on the total weight of the dried film.

The content of salt-forming groups in the binder or mixture of binders, in general, amounts to 2–20 weight-% and is preferably located at 2–15 weight-%.

Used as non photohardenable, plasticizing compounds, among others, are the conventional diesters of phthalic acid, sebacic acid, adipic acid and caproic acid, moreover, alkyl phosphates, tricresyl phosphate, glycerol esters, such as glycerol triacetate, derivatives of polyethylene glycols, such as triethylene glycol dicaprylate and polyhydroxyethylene glycol ethers, such as polyhydroxyethylene lauryl ether.

However, especially preferred are plasticizing, not photohardenable compounds which contain salt-forming groups and, therefore, can be cross linked into the binder system. Suitable for this are chiefly liquid polymers based on acrylate/methacrylate and butadiene/acrylonitrile polymers, which contain reactive salt-forming groups, especially carboxyl and hydroxyl groups distributed along the polymer chain. Low-molecular-weight compounds, such as trimethylolpropane etc. also are suitable.

These plasticizing compounds can be used alone or in combination with other conventional plasticizing compounds.

The content of these compounds in the photohardenable mixture in general, amounts to 5–30 weight-% based on the total weight of the dried film.

Suitable as photohardenable compounds are the known photopolymerizable monomers or polymeric compounds, which contain the light-sensitive groups, by means of which in the exposure a cross linking of the polymer chain takes place. Especially suitable are polymers, which contain $\alpha,\beta$-unsaturated carboxylic acid esters groups, arylazide or arylsulfonazide groups in the side chains. Such compounds are described in Chapter 4 of the book "Light-sensitive Systems" by Jaromir Kosar, New York 1965.

However, of particular importance within the scope of the present invention are the photopolymerizable monomers.

Suitable monomers for preparing photohardable films are known in great number from the literature.

These compounds have several addition polymerizable ethylenic bonds, especially terminal ones and combinations of these functional monomers also are possible.

Mentioned in detail are: Unsaturated esters, for example, acrylic and methacrylic acid esters of multivalent alicyclic and cyclic polyols, as well as aromatic hydroxyl compounds, such as, ethylene diacrylate, diethylene glycol diacrylate, glycerol diacrylate and triacrylate, 1,3-propanediol dimethacrylate, 1,2,4-butanetriol trimethacrylate, 1,5-pentanediol diemthacrylate, pentaerythritol tetramethyacrylate, trimethylolpropane trimethacrylate, 1,4-cyclohexanediol diacrylate, 1,4-hydroquinone dimethacrylate or the bis-acrylates and bis-methacrylates of bis-phenol A, its alkoxylated derivatives and those obtained through reaction with epichlorohydrin, such as tetra-alkoxylated bis-phenol A diacrylate and the bis-acrylates and bis-methacrylates or polyethylene glycols with a molecular weight of 200–500. Unsaturated amides, for example, methylene-bis-acrylamide, methylene-bis-methacrylamide, ethylene-bis-methyacrylamide, 1,6-hexamethylene-bis-acrylamide, diethylenetriamine-tris-methacylamide, bis($\gamma$-methacrylamidopropoxy)-ethane, $\beta$-methacrylamidoethyl methacrylate, N-($\beta$-hydroxyethyl)-$\beta$-(methacrylamido-ethyl acrylate and N,N-bis-($\beta$-methacrylyloxyethyl) acrylamide; vinyl esters, for example, divinyl succinate, divinyl adipate, divinyl phthalate, divinyl terephthalate, divinylbenzene-1,3-disulfonate and divinylbutane-1,4-disulfonate; unsaturated aldehydes, for example, sorbaldehyde (hexadienal).

Also suitable are the esters and amides of $\alpha$-methylenecarboxylic acids and substituted $\alpha$-methylenecarboxylic acids and polyols and polyamides, in which the molecular chain between the hydroxyl or amino groups consists only of carbon atoms or of carbon atoms with hetero atoms introduced between.

These polymerizable compounds are multifunctional, but the corresponding monofunctional compounds also can be used.

Suitable photopolymerizable substances in the same sense are epoxy acrylate oligomers as well as aliphatic polyester/urethane acrylates and oligomeric reaction products of multifunctional arcylates or methyacrylates with, for example, hydrogen sulfide.

Preferred within the scope of the invention, however, are monomers which contain salt-forming groups, such as reaction products of photopolymerizable glycidyl-group-containing compounds with carboxylic acids or their derivatives, multivalent alcohols or phenols, as well as aromatic carboxylic acids containing hydroxyl groups, especially phthalic acid, pyromellitic acid, bisphenol A, as well as its reaction products with epichlorohydrin, hydroxybenzoic acid, for example, di-(3-methacryloxy-2-hydroxypropyl) and di-(3-acryloxy-2- hydroxypropyl) ethers of bisphenol A, mono-2-methacryloyloxyethyl phthalate, di-2-methacryloyloxyethyl pyromellitate, mono-2-methacyloyloxy-2-hydroxypropyl hydroxybenzoate.

The fraction by weight of monomers in the mixture, in general, amounts to about 10–80 weight-%, preferably 20–60 weight-% based on the total weight of the dried film.

As photopolymerization initiators, practically all compounds known for this purpose can be used. The photoinitiator system initiating the addition polymerization may contain one or several compound which either yield free radicals directly when they are activated by radiation, or after they are excited to do this by a sensitizer that is activated by the radiation. Mentioned as examples of suitables photoinitators or initiator systems are:

Vicinal ketaldonyl compounds and their derivatives, such as diacetyl, benzil, benzil dimethyl ketal; α-ketaldonyl alcohols, such as benzoin and pivaloin, acyloin ethers, such as benzoin ethyl and benzoin isopropyl ethers; α-hydrocarbon-substituted aromatic acyloin compounds, such as α-methylbenzoin, α-allylbenzoin and α-phenylbenzoin; multinuclear quinone compounds, such as 1,4-naphthoquinone and 9,10-phenanthrenequinone; a combination of hexaarylbisimidazoles and H donors, such as mercaptobenzoxazole, dimedone, polyoxyethylene, n-phenylglycine, triethanolamine, p-aminophenyl ketone; Michler's ketone and benzophenone, also in combination, as well as systems of substituted thioxanthones and tertiary amines.

Combinations of various types of initiators also are possible. Preferably, the concentration of the free radical forming photoinitiator system amounts to about 0.01–15 weight-% based on the total weight of the dried film.

Aside from the already-mentioned components, the photohardenable mixture may contain further additives, such as sensitizers, pigments, fillers, thermal stabilizers, oxygen trappers, UV absorbers, optical brighteners, antioxidants, casting aids or others.

The selection of the photopolymerizable compounds and optionally the not photohardenable plasticizing compounds should take place so that these components possess a high compatibility in the binder or mixture of binders used. In this case, clear films are obtained which do not lead to disturbing turbidities. In addition, the low-molecular-weight components capable of diffusing then have a smaller tendency to diffuse out of the films.

According to an especially preferred embodiment, photohardenable compounds and/or non photohardenable, plasticizing compounds, which likewise contain salt-forming groups, are used.

In this case, photohardenable materials can be processed in very thin films for the color proofing process on permanent supports, which, in general, presents difficulties, because the plasticizing components, on longer times of storage during the processing, easily diffuse out of thin films, especially the first film, which leads to fluctuations in sensitivity and quality of reproduction.

With the use of cross-linkable, photohardenable compounds and/or non photohardenable, plasticizing compounds, image-forming materials with film thicknesses of 2 $\mu$m can be prepared without appearance of the above-mentioned disadvantages.

One advantage of thinner films consists in that the undesired optical dot enlargement, caused by light scattering in the film, is reduced as a consequence of the smaller light scattering.

The photohardenable mixtures can be applied according to known methods to suitable film supports and subsequently dried.

Examples of suitable film supports are paper, metallic supports, glass and ceramic supports as well as film supports of synthetic resin films, such as polyethylene, polypropylene, polycarbonate, polyamide, polyvinyl chloride, polyester and the like. For the use of color testing, transparency for actinic radiation is a necessary condition.

Preferably, the materials are provided in a known manner on the side of the photohardenable film that is away from the support with a flexible protective film or cover film, for example, a thin film of polystyrene, polyethylene, polypropylene, polyethylene terephthalate or another material that can be pulled off, to prevent contamination or damaging of the light-sensitive film during storage or handling, as well as to prevent the inhibiting effect of oxygen.

Depending on the anticipated use, the film thickness of the photohardenable film can be between 2 $\mu$m and 1 mm.

The photohardenable materials used according to the invention possess their maximum sensitivity in the ultraviolet region, preferably in the wave-length region between 250 and 450 nm. Examples of suitable radiation sources, aside from sunlight, which supplies an effective quantity of this radiation, are xenon lamps, mercury vapor lamps and carbon-arcs, lasers, fluorescent lamps with fluorescent materials emitting UV radiation and electronic flash devices.

For toning the unexposed regions, toners consisting of finely-divided powders of the most varied compositions can be used, such as are disclosed, for example, in the German Pat. Nos. 1 904 058 and 2 946 896. Mentioned as examples are inorganic or organic pigments, fluorescent materials, metal powders or even soluble organic dyes in pure form or together with a powdered organic or inorganic support, such as titanium dioxide, $SiO_2$, glass powder, carbon (carbon black or graphite), metal phthalocyanines, azo dyes, metal powders of aluminum, copper, iron, gold or silver or metal oxides. The toner may also contain additives such as wetting agents, antistatics, inert polymers etc.

Applications of the toner to the unexposed film can take place either manually, for example, with the use of a pillow of various materials, such as gauze, or with the use of special, automatic applying devices. Suitable methods are known to the expert in the field.

The photohardenable material according to the invention can be used to reproduce line and screen photographs for use in the graphic and other industrial arts, for preparation of maps, advertising prints, posters, as well as for preparing and checking printed circuits and for the preparation of colored television screens.

However, the principal field of use is in the preparation of single-color or multi-color pictures and the use in color proofing processes. Carrying out a color proofing process encompasses the following working steps:

After removal of the covering film, the photohardenable material is laminated to an image receiving material, whereby the photohardenable film, both in the polymerized and in the unpolymerized state displays a greater adhesion to the surface of the image-receiving material than to the film support.

Suitable as image-receiving material are supports, such as paper, cardboard, metals, wood, glass, ceramics, porcelain, silk, cotton, films or plates of polymers, such as polyethylene, polyester, polyvinyl chloride, and polyamide. The image-receiving material can be unchanged or have a coating which, in addition to the usual components, may contain additional materials, such as pigments, fillers, optical brightners, UV absorbers and antistatics.

Then, the material is exposed through the transparent film support with the use of a color separation positive or negative of a color as original, with actinic radiation for the formation of nontacky regions. Thereby, the adhesion temperature is increased selectively in the exposed regions.

Then, the film support is removed through delamination, without removal of the exposed, hardened regions and the unexposed, unhardened regions of the image-forming material.

The latent image produced on the image receiving material is made visible through application and distribution of a toner, which adheres exclusively to the unexposed portions of the film.

The toner is removed physically from the hardened image portions, which are then completely free of toner.

A second laminate of the photohardenable material is laminated on the image after removal of the covering film and exposed and toned under similar conditions through a color separation negative or positive of a second color as original.

This process is then repeated for a color separation of a third color and, if desired, for a black separation.

In this manner, a four-colored picture is obtained corresponding to the originals.

Finally, protecting film can be applied to the single-color or multi-color picture, which consists, for example, of an additional laminate of the photohardenable material, from which, after surface exposure, the film support can be removed.

With the use of the photohardenable mixtures or the image-forming materials prepared therefrom according to the invention, independent of the toning temperature present, images can be prepared, which are characterized by a high color density as well as an outstanding color reproduction.

As a result of the reduced diffusion of the film components capable of diffusion, color densities are obtained which are stable over a long period of time, above all in the first film, that is in contact with the image-receiving material.

Moreover, the limited diffusion makes possible the processing of thin films of the photohardenable material, with the advantage of a reduction of the optical dot growth.

That it would be possible with the combination according to the invention to eliminate the temperature dependence of the toning process, without impairment of other properties, was surprising to the expert in the field. Namely, it is known, for example, from the British Pat. No. 1 179 252, that the cross linking of polymers with salt-forming groups by metal cations is a thermally reversible process, in which the cross-linked places again open up at elevated temperature. Consequently, the expert in the field would expect that the quality fluctuations caused by the temperature dependence of the toning process would be reinforced by a likewise temperature-dependent cross-linking process.

Besides, it is known from the state of the art cited in the description that the tackiness of photohardenable films can be reduced or eliminated through cross-linking reactions. Rather, the expert in the field would have considerable prejudice against the use of such cross-linking agents in image-forming materials, in which the image formation is based on a differentiation between tacky and nontacky regions, since it would be expected in this case that the largely standardized, high color densities, required above all by the printing industry, could not be reached.

The following examples will illustrate the invention:

EXAMPLE 1

A coating solution with the following composition:

| | |
|---|---|
| methylene chloride | 113.0 g |
| methanol | 1.6 g |
| copolymer of methyl methacrylate, ethyl acrylate, acrylic acid (32/50/10 parts by weight), mw = 260 000, $T_g$ = 37° C. | 5.6 g |
| diacrylate ester of a bisphenol A-epoxy resin, obtained from bisphenol A and epichlorohydrin (viscosity = 1 000 000 cps) | 2.5 g |
| UV-reactive oligomer from trimethylolpropane triacrylate and hydrogen sulfide | 2.9 g |
| 2-o-chlorophenyl-4,5-bis(phenyl)-imidazolyl dimer | 0.2 g |
| 2-mercaptobenzoxazole | 0.1 g |
| copolymer of ethyl acrylate/acrylic acid (92/8 parts by weight), mw = 7 000 | 2.4 g |
| 7-(4'-chloro-6'-diethylamino-1',3',5'-triazine-4'-yl)-amino-3-phenylcumarin | 0.4 g |
| p-methoxyphenol | 0.003 g |
| zinc acetylacetonate (dissolved in 12 ml of a mixture of methylene chloride/methanol (5:1, v/v) | 0.4 g | is applied to a polyethylene terephthalate film (12.5 μm) in such a way that, after drying, a 5 μm thick, photopolymerizable film is obtained. Subsequently, a 19 μm thick, transparent covering film of polypropylene is laminated on.

To prepare a four-color picture, the photopolymerizable film is laminated onto the image-receiving material (Kromekote paper) with simultaneous removal of the covering film. It is then exposed through a positive cyan color separation containing a screen tone and complete area in a vacuum printing frame with the use of a metal halide lamp (3,000 watts) and with the use of an ultraviolet filter (Kokomo filter) for 42 sec at a distance of 95 cm. The polyethylene terephthalte film is removed and a customary cyan toner is applied to the exposed surface in an automatic toning machine. The toner remains adherent only to the unexposed, tacky places of the film. A second layer of the photopolymerizable film is laminated onto the surface of the toned material, exposed as above through the corresponding magenta color separation (47 sec) and toned with a conventional magenta toner. For the colors yellow (exposure time 47 sec) and black (exposure time 60 sec), the corresponding working steps are repeated. After the last color is toned, a protective film is applied. For this, a fifth photopolymerizable film is laminated on, exposed and the polyethylene terephthalate film is pulled off. Thereafter, the color densities are measured with a commercial densitometer with broad-band filters. The following densities are obtained, compared with those required, for example, in offset printing:

TABLE 1

|  | Density values | | | |
|---|---|---|---|---|
|  | cyan | magenta | yellow | black |
| Densities required in offset printing | 1.35 ± 0.05 | 1.25 ± 0.05 | 0.85 ± 0.05 | .50 ± 0.10 |
| Sample | 1.36 | 1.22 | 0.83 | 1.66 |

EXAMPLE 2

A coating solution with the following composition:

| | |
|---|---|
| methylene chloride | 660.0 g |
| methanol | 11.0 g |
| copolymer of methyl methacrylate, ethyl acrylate, acrylic acid (32/58/10 parts by weight), mw = 260 000, $T_g$ = 37° C. | 40.0 g |
| trimethylolpropane trimethacrylate | 37.0 g |
| 2-o-chlorophenyl-4,5-bis(phenyl)-imidazolyl dimer | 1.5 g |
| 2-mercaptobenzoxazole | 0.8 g |
| copolymer of ethyl acrylate/acrylic acid (92/8 parts by weight), mw = 7 000 | 17.0 g |
| 7-(4'-chloro-6'-diethylamino-1',3',5'-triazine-4'-yl-amino-3-phenylcumarin | 1.8 g |
| p-methoxyphenol | 0.018 g | is prepared and then divided into 7 samples (a)–(g) and the compounds given in Table 2 are added to the individual samples in the corresponding amounts. The coating solutions are cast as in Example 1, dried and provided with a covering film. Subsequently the samples were conditioned in an air-conditioned room at 18° C., then laminated onto the image-receiving film, according to the information of Example 1, toned with a cyan toner and provided with a protective film.

Analogously, a second sample series is processed at 27° C. and a third at 35° C. The densitometrically measured cyan densities are compiled in Table 2.

TABLE 2

|  | Cyan densities at various temperatures | | |
|---|---|---|---|
|  | 18° C. | 27° C. | 35° C. |
| (a) without cross linker | 1.32 | 1.44 | 1.55 |
| (b) 0.80 g aluminum acetylacetonate | 1.29 | 1.36 | 1.39 |
| (c) 0.32 g zinc acetate | 1.31 | 1.36 | 1.37 |
| (d) 0.25 g zirconium acetylacetonate | 1.37 | 1.41 | 1.41 |
| (e) 1 ml triethanolamine titanate 80% in isopropanol | 1.34 | 1.39 | 1.40 |
| (f) 0.12 g ZnO | 1.31 | 1.37 | 1.40 |
| (g) 0.39 g zinc acetylacetonate | 1.36 | 1.38 | 1.39 |

EXAMPLE 3

A coating solution with the following composition:

| | |
|---|---|
| methylene chloride | 1000.0 g |
| methanol | 56.0 g |
| copolymer of methyl methacrylate, ethyl acrylate, acrylic acid (39/57/4 parts by wt), | 29.0 g |
| $T_g$ = 37° C. | |
| copolymer of methyl methacrylate, ethyl acrylate, acrylic acid (62/26/12 parts by wt), mw = 200 000, $T_g$ = 70° C. | 42.0 g |
| trimethylolpropane trimethacrylate | 20.0 g |
| diacrylate ester of a bisphenol A-epoxy resin obtained from bisphenol A and epichlorohydrin (viscosity = 1 000 000 cps) | 27.0 g |
| trimethylolpropane | 8.0 g |
| glycerol triacetate | 10.0 g |
| 2-o-chlorophenyl-4,5-bis(phenyl)-imidazolyl dimer | 3.0 g |
| 2-mercaptobenzoxazole | 1.0 g |
| copolymer of ethyl acrylate/acrylic acid (92/8 parts by wt), mw = 7 000 | 9.0 g |
| 7-(4'-chloro-6'-diethylamino-1',3',5'-triazine-4'-yl)-amino-3-phenylcumarin | 3.0 g |
| p-methoxyphenol | 0.03 g | is divided into 4 samples (a)–(d) and the individual samples are treated with the amounts of zinc acetylacetonate given in Table 3 and toned with a cyan toner at 18° C. and 35° C. according to the information of Example 1. The densitometrically measured color densities are given in Table 3.

TABLE 3

|  |  | Cyan densities at various temperatures | |
|---|---|---|---|
|  |  | 18° C. | 35° C. |
| (a) |  not cross linked | 1.32 | 1.49 |
| (b) | 0.38 g zinc acetylacetonate | 1.32 | 1.43 |
| (c) | 0.97 g zinc acetylacetonate | 1.32 | 1.40 |
| (d) | 1.38 g zinc acetylacetonate | 1.29 | 1.37 |

EXAMPLE 4

A coating solution with the following composition:

| | |
|---|---|
| methylene chloride | 86.0 g |
| methanol | 1.6 g |
| copolymer of methyl methacrylate, ethyl acrylate, acrylic acid (32/58/10 parts by wt), mw = 260 000, $T_g$ = 37° C. | 6.0 g |
| trimethylolpropane trimethacrylate | 5.3 g |
| 2-o-chlorophenyl-4,5-bis(phenyl)-imidazolyl dimer | 0.2 g |
| 5,5-dimethylcyclohexane-1,3-dione | 0.1 g |
| triethylene glycol diacetate | 1.0 g |
| 7-(4'-chloro-6'-diethylamino-1',3',5'-triazine-4'-yl)-amino-3-phenylcumarin | 0.2 g | is divided into 2 parts (a) and (b), one sample is then cast directly, the second after addition of 0.16 g of zinc acetylacetonate according to the information in Example 1, in such a way that in each case a photopolymerizable film with a thickness of 3 μm was present after the drying. The material is then provided with a customary covering film. Subsequently, two images of each were prepared by laminating the film concerned on Kromekote paper according to the information of Example 1, exposed through the cyan color separation, toned and provided with a protective layer. Thereby, in one case the toner was applied immediately after the exposure and in the other after a holding time of 1 hour. The differences for the cyan densities measured with and without holding time are compiled in Table 4.

TABLE 4

| Sample | cyan density difference with and without holding time |
|---|---|
| (a) without cross linker | 0.23 |
| (b) with cross linker | 0.09 |

EXAMPLE 5

A coating solution with the following composition:

| | |
|---|---|
| methylene chloride | 270.0 g |
| methanol | 16.0 g |
| copolymer of methyl methacrylate, ethyl acrylate, acrylic acid (32/58/10 parts by wt), mw = 260 000, $T_g = 37°$ C. | 17.0 g |
| mono-2-methacryloyloxyethyl phthalate | 8.0 g |
| di-methacryloyloxyethyl pyromellitate | 8.0 g |
| 2-o-chlorophenyl-4,5-bisphenyl-imidazolyl dimer | 0.65 g |
| 2-mercaptobenzoxazole | 0.32 g |
| copolymer of ethyl acrylate/acrylic acid 92/8 parts by wt). mw = 7 000 | 7.2 g |
| 7-(4'-chloro-6'-diethylamino-1',3',5'-triazine-4'-yl)-amino-3-phenylcumarin | 0.75 g |
| p-methoxyphenol | 0.01 g |
| zinc acetylacetonate | 1.0 g | is applied to a polyethylene terephthalate film in such a way that, after drying, a 4 μm thick photopolymerizable film is obtained. This is provided with a protective film and subsequently processed to a cyan image on a Kromekote image-receiving film as given in Example 4, with a holding time of 2 hours between exposure and toning. The cyan densities differ by only 0.05 density units.

EXAMPLE 6

Two coating solutions with the following compositions:

| Sample a | |
|---|---|
| methylene chloride | 580.0 g |
| methyl methacrylate polymer, mw = 629 000, $T_g = 95°$ C. | 25.0 g |
| vinyl acetate polymer, mw = 120 000, $T_g = 30°$ C. | 10.0 g |
| trimethylolpropane trimethacrylate | 33.0 g |
| 2-o-chlorophenyl-4,5-bisphenyl-imidazolyl dimer | 1.4 g |
| 2-mercaptobenzoxazole | 0.6 g |
| polyethylene oxide dilauryl ether | 6.0 g |
| hydroquinone | 0.04 g |
| 7-(4'-chloro-6'-diethylamino-1',3',5'-triazine-4'-yl)-amino-3-phenylcumarin | 1.0 g |
| Sample b | |
| methylene chloride | 945.0 g |
| methanol | 16.0 g |
| copolymer of methyl methacrylate, ethyl acrylate, acrylic acid (32/58/10 parts by wt), mw = 260 000, $T_g = 37°$ C. | 60.0 g |
| trimethylolpropane trimethacrylate | 42.0 g |
| mono-2-methacryloyloxyethyl phthalate | 1.0 g |
| 2-o-chlorophenyl-4,5-bisphenyl- | 2.0 g |

-continued

| | |
|---|---|
| imidazolyl dimer | |
| 2-mercaptobenzoxazole | 1.0 g |
| copolymer of ethyl acrylate/acrylic acid (92/8 parts by wt), mw = 7 000 | 24.0 g |
| 7-(4'-chloro-6'-diethylamino-1',3',5'-triazine-4'-yl)-amino-3-phenylcumarin | 4.0 g |
| p-methoxyphenol | 0.04 g |
| zinc acetyl acetonate | 4.0 g | are cast, dried, provided with a covering film and processed to four-color proofs according to the information in Example 1. The first two are prepared at 18° C., the second 27° C. and the third at 35° C. The densitometrically measured densities are compiled in Table 5.

TABLE 5

| Color | Sample | Density values at various temperatures | | | Density difference between 18° C. and 35° C. |
|---|---|---|---|---|---|
| cyan | a | 1.14 | 1.37 | 1.47 | 0.33 |
| cyan | b | 1.36 | 1.38 | 1.39 | 0.03 |
| magenta | a | 1.03 | 1.24 | 1.31 | 0.28 |
| magenta | b | 1.22 | 1.24 | 1.26 | 0.04 |
| yellow | a | 0.80 | 0.91 | 0.94 | 0.14 |
| yellow | b | 0.88 | 0.91 | 0.91 | 0.03 |
| black | a | 1.45 | 1.58 | 1.78 | 0.33 |
| black | b | 1.61 | 1.66 | 1.69 | 0.08 |

EXAMPLES 7–10

Ingredients as indicated below are dissolved in methylene chloride at 15% solids. The zinc compound is added last. Film is cast from a 0.0015 inch (0.038 mm) coating knife onto 0.0005 inch (0.013 mm) polyethylene terephthalate film giving a 0.00015 inch (0.0038 mm) coating after solvent removal. The solvent is removed by air drying. This coating is laminated at about 110° C. to the smooth side of Kromekote ® cast-coated one-side paper. A 150 lines/inch 50% halftone screen tint is placed on top. The sample plus tint is placed in a vacuum contact frame and exposed with a 5 KW photopolymer lamp and Kokomo ® glass filter (No. 400). A sharp exposure is given such that 2% highlight dots are just held. After exposure, the tint and polyethylene terephthalate film are removed. An Automatic Toning Machine Model 2900 manufactured by E. I. du Pont de Nemours and Company, Wilmington, Del. is used to apply a yellow colorant material described in Example 9 of U.S. Pat. No. 4,215,193 to the photopolymer surface.

A second clear photopolymer layer is laminated onto the yellow toned first layer at 110° C. As outlined above the two-layer element is then exposed through a 150 lines/inch 50% tint and the coversheet removed. To the photopolymer surface a magenta colorant material described in Example 11 of U.S. Pat. No. 4,215,193 is applied. This procedure is repeated two more times toning the third layer with a cyan colorant material described in Example 1 of U.S. Pat. No. 4,215,193 and the fourth layer with a black colorant material described in Example 10 of U.S. Pat. No. 4,215,193.

After application of the black toner, a fifth photopolymer element is laminated at 110° C. over the four-color halftone positive. The five-layer element is given an overall blanket exposure under the above described light source. Next, the polyethylene terephthalate coversheet is removed.

The effective dot areas (EDA) of the toned tint in the finished proof are measured using a Macbeth RD-918 densitometer. The yellow, magneta, cyan, black tints are measured using a green, blue, red, and visual filters respectively. As explained above, the Murray-Davies equation is used to calculate the effective dot area. The following results are obtained for the indicated colored toners wherein the dot gain is the effective dot area minus the screen tint (50).

EXAMPLES 7 TO 10

| Ingredient | Amount (g) |
|---|---|
| Diacrylate ester of bisphenol A epoxy resin derived from bisphenol A and epichlorohydrin viscosity (25° C.) = 1,000,000 cps | 18.48 |
| Trimethylolpropanetrimethacrylate | 13.66 |
| Optical brightener[1] | 2.06 |
| 2-Mercaptobenzoxazole | 0.83 |
| 2,2'-Bis-(o-chlorophenyl)-4,4',5,5'-tetraphenylbiimidazole | 1.71 |
| Trimethylolpropane | 5.08 |
| Glycerol triacetate | 6.75 |
| Methoxyhydroquinone | 0.022 |
| Thermal inhibitor[2] | 0.05 |
| Diethylhydroxylamine | 0.09 |
| Ethyl acrylate (57%)/methylmethacrylate-(39%) acrylic acid(4%) copolymer MW = 192,000; Acid No. = 57; Tg = 33° C. | 18.06 |
| Ethyl acrylate, Acid No. = 63; Tg = −14° C. viscosity (25° C., = 2,000,000 cps; MW = 7,000 | 5.40 |
| Ethyl acrylate (17%)/methylmethacrylate-(71%)/acrylic acid(12%) copolymer MW = 200,000; Acid No. = 100; Tg = 80° C. | 25.15 |
| Polycaprolactone MW = 15,000; M.P. = CO° C.; Tg = CO° C. | 0.20 |
| Zinc acetylacetonate(2.45 grams) dissolved in 37.0 grams of methanol | 39.45 |

[1] 7-(4'Chloro-6'-diethylamino 1',3',5'- triazine 4'-yl)amino 3-phenyl coumarin
[2] 1,4,4-Trimethyl-2,3-diazobicyclo-(3.2.2)- non-2-ene-2,3-dioxide

| Toner | 50% Dot Gain |
|---|---|
| (7) Yellow | 18 |
| (8) Magenta | 18 |
| (9) Cyan | 18 |
| (10) Black | 19 |

We claim:

1. A process for reducing temperature dependency during toning which comprises
   (a) laminating a photohardenable image-forming material on an image-receiving film wherein said image-forming material comprises a synthetic resin support layer and a photohardenable layer having a thickness from about 2 microns to about 1 mm consisting essentially of a mixture of:
   (i) about 10 to about 80 weight % of at least one ethylenically unsaturated photopolymerizable compound based on the total weight of the dried film;
   (ii) about 20 to about 90 weight % of binder based on the total weight of the dried film wherein a binder is selected from the group consisting of single polymers with Tg≦70° C. and mixtures of polymers each with Tg≦80° C., the binder is at least one thermoplastic copolymer selected from the group consisting of esters of acrylic acid and esters of methacrylic acid, and the copolymer possesses at least 2 weight percent salt forming groups selected from the group consisting of carboxyl, sulfonic acid, sulfonamide and hydroxyl groups;
   (iii) at least one crosslinking agent selected from the group consisting of compounds of mulivalent metals of groups IIA—IVA, IIB—IVB and VIIB of the Periodic Chart, said agent being present in an effective amount to reduce temperature dependency during toning wherein fluctuations in achievable toned density due to temperature are less than fluctuations in achievable toned density in a tonable film comprising a synthetic resin support layer and a photohardenable layer consisting essentially of (i), (ii) and (iv); and
   (iv) about 0.01 to about 15 weight percent of a photoinitiator or photoinitiating system activatable by actinic radiation based on the total weight of the dried film;
   (b) image-wise exposing to produce nontacky regions;
   (c) removing the film support;
   (d) applying toner to the tacky regions, whereby lamination, exposure, removal of the film support and toning are repeated several times.

2. A process according to claim 1 wherein at least about 10.0 mole % of the salt forming groups of the image-forming material are crosslinked.

3. A process according to claim 1 wherein the synthetic resin support layer is transparent and the photohardenable layer has a thickness from about 2 microns to about 5 microns.

4. A process according to claim 1 wherein the metal compound is a chelate of a cation selected from the group consisting of magnesium, calcium, strontium, barium, aluminum, tin, zinc, titanium, zirconium, and manganese.

5. A process according to claim 1 wherein the photohardenable layer also contains a non-photohardenable plasticizing compound which contains a salt-forming groups.

6. A process according to claim 1 wherein the crosslinking agent is selected from the group consisting of zinc and zirconium acetylacetonates, the binder is at least one polymer selected from the group consisting of copolymers of acrylic acid and methacrylic acid with acrylates and methacrylates.

7. A process according to claim 1 wherein the photopolymerizable compound is an addition-polymerizable compound.

* * * * *